US012573590B2

(12) United States Patent　　　　　(10) Patent No.:　US 12,573,590 B2
Na et al.　　　　　　　　　　　　　　　　(45) Date of Patent:　　Mar. 10, 2026

(54) PLASMA PROCESSING APPARATUS AND METHOD OF MANUFACTURING SEMICONDUCTOR DEVICE BY USING SAME

(71) Applicant: SAMSUNG ELECTRONICS CO., LTD., Suwon-si (KR)

(72) Inventors: Donghyeon Na, Hwaseong-si (KR); Kyungsun Kim, Suwon-si (KR); Soonam Park, Suwon-si (KR); Seungbo Shim, Suwon-si (KR); Janggyoo Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 774 days.

(21) Appl. No.: 17/847,406

(22) Filed: Jun. 23, 2022

(65) Prior Publication Data

US 2023/0154729 A1　　May 18, 2023

(30) Foreign Application Priority Data

Nov. 16, 2021　(KR) ........................ 10-2021-0158038

(51) Int. Cl.
H01J 37/32　　　　(2006.01)
(52) U.S. Cl.
CPC ... H01J 37/32183 (2013.01); H01J 37/32642 (2013.01); H01J 37/32715 (2013.01); H01J 2237/2007 (2013.01); H01J 2237/334 (2013.01)
(58) Field of Classification Search
CPC ............. H01J 37/32091; H01J 37/3211; H01J 37/32165
See application file for complete search history.

(56) References Cited

U.S. PATENT DOCUMENTS 9,741,545 B2　　8/2017　Chen et al.
9,799,491 B2　　10/2017　Dorf et al.
(Continued)

FOREIGN PATENT DOCUMENTS

KR　　　20050120862 A　*　12/2005
KR　　　10-1488538 B1　　2/2015
(Continued)

OTHER PUBLICATIONS

Communication issued on Sep. 24, 2025 by the Korean Intellectual Property Office in Korean Patent Application No. 10-2021-0158038.

*Primary Examiner* — William B Partridge
*Assistant Examiner* — Felix B Andrews
(74) *Attorney, Agent, or Firm* — Sughrue Mion, PLLC

(57)　　　　　　　　　ABSTRACT

A plasma processing apparatus includes: a plasma chamber including a first area and a second area; a first radio frequency (RF) power source transmitting pieces of first RF power to the first area; a second RF power source transmitting second RF power to the second area; a controller configured to control the first RF power source and the second RF power source; and a first coil and a second coil arranged in the second area, wherein the controller spatially controls plasma in the first and second areas by controlling a signal of a current applied to the first coil and a signal of a current applied to the second coil, and temporally controls the plasma in the first and second areas by controlling a signal of the first RF power transmitted from the first RF power source and a signal of the second RF power transmitted from the second RF power source.

11 Claims, 11 Drawing Sheets

(56) References Cited

U.S. PATENT DOCUMENTS

| | | | |
|---|---|---|---|
| 9,966,274 B2 | 5/2018 | Kim et al. | |
| 10,056,233 B2 | 8/2018 | Chen et al. | |
| 10,840,082 B2 | 11/2020 | Singhal et al. | |
| 2010/0314048 A1* | 12/2010 | Long | H01J 37/3211 |
| | | | 156/345.48 |
| 2015/0043123 A1* | 2/2015 | Cox | H01L 21/6833 |
| | | | 29/611 |
| 2015/0206716 A1* | 7/2015 | Kim | H01J 37/32183 |
| | | | 118/723 R |
| 2015/0376792 A1 | 12/2015 | Spurlin et al. | |
| 2017/0092470 A1 | 3/2017 | Ramaswamy et al. | |
| 2017/0099722 A1* | 4/2017 | Kawasaki | H01J 37/32174 |
| 2017/0207069 A1* | 7/2017 | Bhatia | C23C 16/452 |
| 2017/0323768 A1 | 11/2017 | Zhang et al. | |
| 2018/0096818 A1 | 4/2018 | Lubomirsky | |
| 2019/0198301 A1 | 6/2019 | Ma et al. | |
| 2019/0267211 A1 | 8/2019 | Pan et al. | |
| 2021/0272782 A1* | 9/2021 | Koshimizu | H01J 37/32862 |

FOREIGN PATENT DOCUMENTS

| | | | | | |
|---|---|---|---|---|---|
| KR | 10-2015-0087702 A | | 7/2015 | | |
| KR | 20150138468 A | * | 12/2015 | | C23C 16/45565 |
| KR | 10-2016-0002394 A | | 1/2016 | | |
| KR | 10-2017-0039557 A | | 4/2017 | | |
| KR | 10-2018-0063359 A | | 6/2018 | | |
| KR | 10-1931742 B1 | | 12/2018 | | |
| TW | I827992 B | * | 1/2024 | | H01J 37/32449 |

* cited by examiner

PLASMA PROCESSING APPARATUS AND METHOD OF MANUFACTURING SEMICONDUCTOR DEVICE BY USING SAME

CROSS-REFERENCE TO RELATED APPLICATION

This application is based on and claims priority under 35 U.S.C. § 119 to Korean Patent Application No. 10-2021-0158038, filed on Nov. 16, 2021, in the Korean Intellectual Property Office, the disclosure of which is incorporated by reference herein in its entirety.

BACKGROUND

The disclosure relates to a plasma processing apparatus and a method of manufacturing a semiconductor device by using the same, and more particularly, to a plasma processing apparatus for controlling a distribution of plasma inside a plasma chamber and a method of manufacturing a semiconductor device by using the same.

In general, a series of processes, such as deposition, etching, and cleaning, may be performed to manufacture semiconductor devices. The processes may be performed via a deposition, etching, or cleaning apparatus having a process chamber. Plasma technology, such as capacitively coupled plasma (CCP), inductively coupled plasma (ICP), or a combination of CCP and ICP, has been used to improve selectivity and minimize film quality damage. Examples of the plasma technology include direct plasma technology for directly generating plasma inside a process chamber that is a wafer processing space, and remote plasma technology for generating plasma outside a process chamber and supplying the generated plasma into the process chamber.

SUMMARY

Example embodiments of the disclosure provide a plasma processing apparatus for temporally and spatially controlling a distribution of plasma inside a plasma chamber and a method of manufacturing a semiconductor device by using the same.

According to an aspect of an example embodiment, a plasma processing apparatus includes: a plasma chamber including a first area including and a second area separated from the first area; an electrostatic chuck provided in the first area of the plasma chamber, and configured to support a wafer; a first radio frequency (RF) power source configured to transmit pieces of first RF power to the first area, wherein a first piece of the pieces of first RF power has a first frequency and a second piece of the pieces of the first RF power has a second frequency different from the first frequency; a second RF power source configured to transmit second RF power to the second area of the plasma chamber; a controller configured to control the first RF power source and the second RF power source; and a first coil and a second coil arranged in the second area, wherein the first coil and the second coil are positioned in a same plane and the first coil surrounds the second coil, and wherein the controller is further configured to: spatially control plasma in the first area and the second area by controlling a signal of a current applied to the first coil and a signal of a current applied to the second coil, and temporally control the plasma in the first area and the second area by controlling at least one of a signal of the pieces of first RF power transmitted from the first RF power source or a signal of the second RF power transmitted from the second RF power source.

According to an aspect of an example embodiment, a plasma processing apparatus includes: a plasma chamber including a first area and a second area separated from the first area; an electrostatic chuck provided in the first area of the plasma chamber, and configured to support a wafer; a ring-shaped edge ring surrounding the electrostatic chuck; an insulating isolation provided at a lower portion of the electrostatic chuck, and configured to insulate the electrostatic chuck; a first radio frequency (RF) power source configured to transmit pieces of first RF power to the first area, wherein a first piece of the plurality of pieces of first RF power has a first frequency and a second piece of the pieces of first RF power has a second frequency different from the first frequency; a second RF power source configured to transmit second RF power to the second area; a distribution plate arranged inside the plasma chamber, the distribution plate including a gas hole and an ion filter configured to filter plasma; a controller configured to control the first RF power source and the second RF power source; and a first coil and a second coil arranged in the second area, wherein the first coil and the second coil are positioned in a same plane and the first coil surrounds the second coil, and wherein the controller is further configured to: spatially control the plasma in the first area and the second area by controlling a signal of a current applied to the first coil and a signal of a current applied to the second coil, and temporally control the plasma in the first area and the second area by controlling at least one of a signal of the pieces of the first RF power transmitted from the first RF power source or a signal of of the second RF power transmitted from the second RF power source.

According to an aspect of an example embodiment, a method of manufacturing a semiconductor device, includes: loading a wafer onto an electrostatic chuck inside a plasma chamber including a first area and a second area, wherein a first coil and a second coil, which are spatially separated from each other, are arranged in the second area; injecting a process gas into the plasma chamber; generating plasma by supplying second radio frequency (RF) power to the second area of the plasma chamber; processing the wafer by supplying pieces of first RF power to the first area of the plasma chamber; and unloading the wafer from the electrostatic chuck, wherein a signal of a current applied to the first coil and a signal of a current applied to the second coil are controlled such that the plasma in the first area or the second area is spatially controlled, and wherein at least one of a signal of the pieces of first RF power or a signal of the second RF power is controlled such that the plasma in the first area or the second area is temporally controlled.

BRIEF DESCRIPTION OF THE DRAWINGS

The above and other aspects, features, and advantages will be more apparent from the following detailed description of certain example embodiments taken in conjunction with the accompanying drawings in which:

Figure 1A:
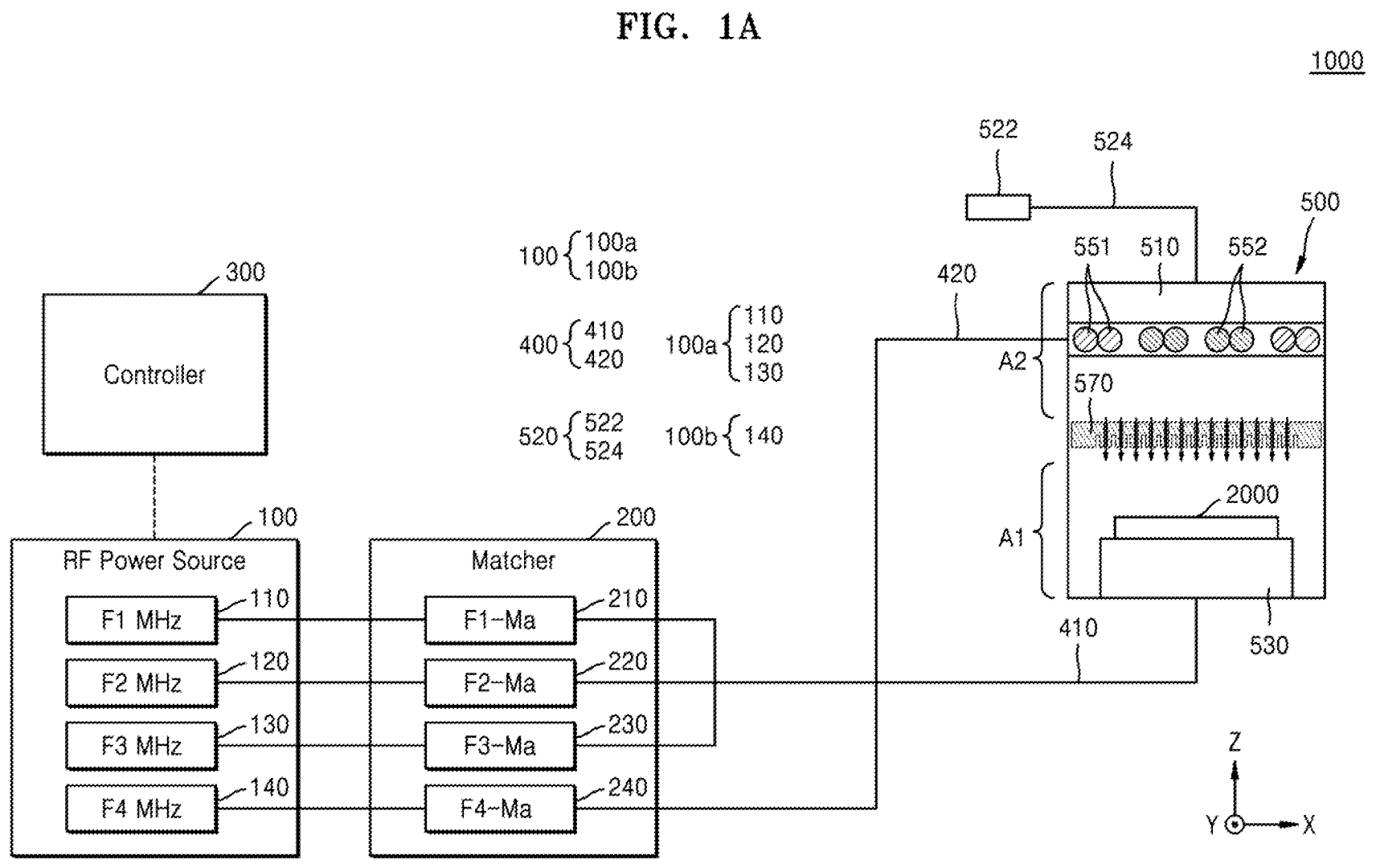

FIGS. 1A and 1B are respectively a block diagram and a circuit diagram of a plasma processing apparatus according to an example embodiment;

FIG. 4 is a block diagram of a plasma processing apparatus according to an example embodiment;

DETAILED DESCRIPTION

Figure 1B:
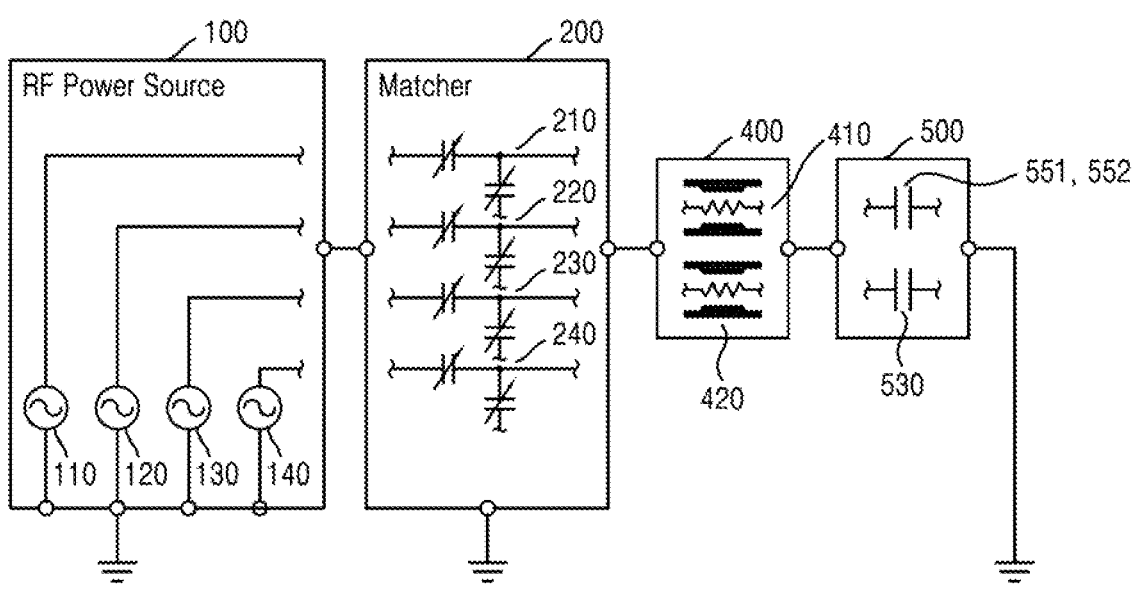

Hereinafter, example embodiments will be described in detail with reference to the accompanying drawings. Like reference numerals in the drawings denote like elements, and thus their description will be omitted.

FIGS. 1A and 1B are respectively a block diagram and a circuit diagram of a plasma processing apparatus 1000 according to an example embodiment.

Referring to FIGS. 1A and 1B, the plasma processing apparatus 1000 according to the example embodiment may include a radio frequency (RF) power source 100, a matcher 200, a controller 300, a transmission line 400, and a plasma chamber 500.

In FIG. 1A, arrows may indicate a travel path of plasma inside a chamber body 510 of the plasma chamber 500.

The plasma processing apparatus 1000 may be configured to generate plasma. The plasma processing apparatus 1000 may include a capacitively coupled plasma (CCP) source, an inductively coupled plasma (ICP) source, a microwave plasma source, a remote plasma source, and the like.

The plasma processing apparatus 1000 may be an apparatus for processing a wafer 2000 by using generated plasma. The plasma processing apparatus 1000 may perform, on the wafer 2000, one of plasma annealing, plasma etching, plasma enhanced chemical vapor deposition, sputtering, and plasma cleaning.

In an example, the plasma processing apparatus 1000 may perform, for example, an isotropic etching process on the wafer 2000. The plasma processing apparatus 1000 may perform a process of substituting silicon oxide formed on the wafer 2000 with ammonium hexafluorosilicate (($NH_4$)$_2$$SiF_6$) and removing the ammonium hexafluorosilicate (($NH_4$)$_2$$SiF_6$) via annealing.

As an example, the plasma processing apparatus 1000 may perform a process of isotropically removing any one of crystalline and/or amorphous silicon, silicon nitride, and metal on the wafer 200 by alternately and repeatedly performing plasma processing and annealing processing on any one of the crystalline and/or amorphous silicon, the silicon nitride, and the metal.

The wafer 2000 may include, for example, silicon (Si). The wafer 2000 may include a semiconductor element such germanium (Ge), or a compound semiconductor such as silicon carbide (SiC), gallium arsenide (GaAs), indium arsenide (InAs), or indium phosphide (InP). According to some embodiments, the wafer 2000 may have a silicon on insulator (SOI) structure. In addition, the wafer 2000 may include a buried oxide layer. According to some embodiments, the wafer 2000 may include a conductive region, e.g., a well doped with impurities. According to some embodiments, the wafer 2000 may have various device isolation structures, such as shallow trench isolation (STI), which isolate the doped wells from each other.

Here, the wafer 2000 may have a diameter of about 300 mm, but is not limited thereto. The diameter of the wafer 2000 may be, for example, about 150 mm, about 200 mm, about 450 mm, or more.

The RF power source 100 may generate RF power and supply the generated RF power to the plasma chamber 500. The RF power source 100 may generate and output pieces of RF power having various frequencies. For example, the RF power source 100 may include four sources, for example, a first source 110, a second source 120, a third source 130, and a fourth source 140. Here, the first source 110 may generate a piece of RF power having a first frequency F1 MHz (e.g., a first piece of RF power) in the range of several MHz to several tens of MHz. The second source 120 may generate a piece of RF power having a second frequency F2 MHz (e.g., a second piece of RF power) in the range of several hundred kHz to several MHz. The third source 130 may generate a piece of RF power having a third frequency F3 kHz in the range of several tens of kHz to several hundred kHz. Also, the fourth source 140 may generate a piece of RF power having a fourth frequency F4 MHz in the range of several MHz to several tens of MHz. In addition, each of the first, second, third, and fourth sources 110, 120, 130, and 140 of the RF power source 100 may generate and output power of several hundreds to tens of thousands of watts (W).

Although described later, RF power from the first, second, and third sources 110, 120, and 130 may be applied to a first area A1 of the plasma chamber 500, and RF power from the fourth source 140 may be applied to a second area A2 of the plasma chamber 500.

For example, the first source 110 may generate RF power having a frequency in the range of about 40 MHz to about 60 MHz, and the second source 120 may generate RF power having a frequency in the range of about 400 kHz to about 2 MHz. Also, the third source 130 may generate RF power having a frequency in the range of about 10 kHz to about 800 kHz, and the fourth source 140 may generate RF power having a frequency in the range of about 13 MHz to about 27 MHz.

In the plasma processing apparatus 1000 of an example embodiment, the RF power source 100 illustratively includes the first, second, third, and fourth sources 110, 120, 130, and 140, but the number of sources included in the RF power source 100 is not limited to four. For example, the RF power source 100 may include three or fewer sources, or five or more sources. In addition, a frequency range and power of RF power generated by the RF power source 100 are not limited to the frequency ranges and power described above. For example, according to embodiments, at least one source included in the RF power source 100 may generate RF power having a frequency of several tens of kHz or less, or several hundred MHz or more. Also, at least one source included in the RF power source 100 may generate RF power having power of several hundred watts or less, or several thousand watts or more.

In addition, FIG. 1A illustrates that the first, second, and third sources 110, 120, and 130 each supply RF power to the first area A1, and the fourth source 140 supplies RF power to the second area A2. However, the number of sources connected to each area may be variously modified. For example, two sources, or four or more sources may be connected to the first area A1, and two or more sources may be connected to the second area A2.

For example, the first, second, and third sources 110, 120, and 130 may be connected to an electrostatic chuck 530 of the plasma chamber 500, and the fourth source 140 may be connected to first and second coils 551 and 552 of the plasma chamber 500. In another example embodiment, the fourth source 140 may be connected to a conductive plate (590 of FIG. 4) of the plasma chamber 500.

The RF power source 100 may include a first RF power source 100*a* and a second RF power source 100*b*. The first RF power source 100*a* may include the first, second, and third sources 110, 120, and 130, and the second RF power source 100*b* may include the fourth source 140. The first RF power source 100*a* may be applied to the first area A1, for example, the electrostatic chuck 530. The second RF power source 100*b* may be applied to the second area A2, for example, the first and second coils 551 and 552.

For reference, in the plasma processing apparatus 1000 of the example embodiment, the RF power source 100 may correspond to a power source for supplying power to the plasma chamber 500. Also, the plasma chamber 500 may be referred to as a kind of load supplied with power from the RF power source 100. Accordingly, in the circuit diagram of FIG. 1B, the plasma chamber 500 is represented by a capacitor element as a load.

In the plasma processing apparatus 1000 of the example embodiment, the RF power source 100 may include at least two sources to generate pieces of RF power having various frequencies and supply the generated pieces of RF power to the plasma chamber 500. Accordingly, energy of ions and a density of plasma inside the plasma chamber 500 may be independently controlled. For example, when the RF power source 100 including the first, second, third, and fourth sources 110, 120, 130, and 140 is described in more detail, pieces of high-frequency RF power from the first and fourth sources 110 and 140 may generate plasma, and pieces of low-frequency RF power from the second source 120 or the third source 130 may supply energy to ions.

Intermediate frequency RF power from the second source 120 may have a function varying according to embodiments. For example, RF power from the second source 120 may enhance functions of pieces of RF power from the first, third, and/or the fourth sources 110, 130, and/or 140. Pieces of RF power may be applied in the form of pulses to improve an etch rate and an etch profile by plasma within the plasma chamber 500.

The plasma processing apparatus 1000 may include the matcher 200. The matcher 200 may allow pieces of RF power from the RF power source 100 to be maximally delivered to the plasma chamber 500 by adjusting imped-ance. For example, the matcher 200 may maximize RF power delivery by adjusting impedance so that a complex conjugate condition is satisfied on the basis of a maximum power delivery theory. In other words, the matcher 200 may allow pieces of RF power from the RF power source 100 to be maximally delivered to the plasma chamber 500 by driving the RF power source 100 in an environment of 50Ω so that reflected power is minimized.

The matcher 200 may include first, second, third, and fourth sub matchers 210, 220, 230, and 240 corresponding to respective frequencies of pieces of RF power. For example, the matcher 200 may include the first sub matcher 210 corresponding to the first frequency F1 MHz of the first source 110, the second sub matcher 220 corresponding to the second frequency F2 MHz of the second source 120, the third sub matcher 230 corresponding to the third frequency F3 MHz of the third source 130, and/or the fourth sub matcher 240 corresponding to the fourth frequency F4 MHz of the fourth source 140. Each of the first, second, third, and fourth sub matchers 210, 220, 230, and 240 may adjust impedance so that RF power having a corresponding fre-quency may be maximally delivered. As described above, when the number of sources is changed, the number of sub matchers of the matcher 200 may also be changed.

The controller 300 may control a signal applied from each of the first RF power source 100*a* and the second RF power source 100*b*. In addition, the controller 300 may control intensities, start time points, and the like of currents applied to the first and second coils 551 and 552. In other words, the controller 300 may temporally and/or spatially control plasma inside the plasma chamber 500. Also, the controller 300 may control the signal applied from each of the first RF power source 100*a* (e.g., the first RF current) and the second RF power source 100*b* (e.g., the second RF current), accord-ing to a composition ratio of a process gas in the first area A1.

The controller 300 may be implemented by hardware, firmware, software, or any combination thereof. For example, the controller 300 may be a computing apparatus such as a workstation computer, a desktop computer, a laptop computer, or a tablet computer. For example, the controller 300 may include a memory device, such as read only memory (ROM) or random access memory (RAM), and a processor configured to perform certain operations and algorithms, for example, a microprocessor, a central pro-cessing unit (CPU), or a graphics processing unit (GPU), and the like. In addition, the controller 300 may include a receiver and a transmitter for receiving and transmitting an electrical signal.

The controller 300 may control and adjust a distribution of plasma inside the plasma chamber 500 by selectively and/or independently controlling very high frequencies (VHFs) from among frequencies of RF power. For example, the controller 300 may control and adjust the distribution of plasma inside the plasma chamber 500 by selectively and/or independently controlling harmonics of the first and fourth frequencies F1 MHz and F4 MHz of the first and fourth sources 110 and 140 corresponding to VHFs. Here, the distribution of plasma may refer to a density distribution of plasma.

The controller 300 may not affect the matcher 200 and the transmission line 400. In other words, in the plasma pro-cessing apparatus 1000 of the example embodiment, addi-tion of the controller 300 may not affect delivery character-istics of pieces of RF power by the matcher 200 and the transmission line 400. When the delivery characteristics of the pieces of RF power by the matcher 200 and the trans-mission line 400 are changed by the addition of the con-troller 300, the matcher 200 and the transmission line 400 need to be redesigned for maximum RF power delivery.

In the plasma processing apparatus 1000 of the example embodiment, the controller 300 may effectively control and adjust the distribution of plasma inside the plasma chamber 500 without affecting RF power delivery characteristics.

The transmission line 400 may be arranged between the matcher 200 and the plasma chamber 500 to deliver pieces of RF power to the plasma chamber 500. In the example embodiment, the controller 300 is arranged as an output terminal of the matcher 200, and thus, the transmission line 400 may be regarded as arranged between the controller 300 and the plasma chamber 500. The transmission line 400 may be arranged also between the RF power source 100 and the matcher 200. The transmission line 400 may include, for example, a conductive material such as copper.

The transmission line 400 may be implemented as, for example, a coaxial cable, an RF strap, an RF rod, or the like. The coaxial cable may include a central conductor, an outer conductor, an insulator, and a sheath. The coaxial cable may have a structure in which the central conductor and the outer conductor are coaxially arranged. In general, the coaxial cable may generate less attenuation even at a high frequency, and thus may be appropriate for broadband transmission, and also, may generate less leakage due to the presence of the outer conductor. Accordingly, the coaxial cable may be mainly used as a transmission cable used when a frequency is high. For example, the coaxial cable may effectively deliver RF power having a frequency in the range of several MHz to several tens of MHz without leakage. The coaxial cable includes two types of coaxial cables having characteristic impedance of 50Ω and 75Ω, respectively.

The RF strap may include a strap conductor, a ground housing, and an insulator. The strap conductor may have a band-like shape extending in one direction. The ground housing may have a circular tube shape enclosing the strap conductor at a certain distance. The ground housing may protect the strap conductor from RF radiation. The insulator may fill a space between the strap conductor and the ground housing. The RF rod may be structurally different from the RF strap in terms of including a rod conductor instead of the strap conductor. In detail, the rod conductor of the RF rod may have a cylindrical shape extending in one direction. The RF strap or the RF rod may deliver, for example, RF power having a frequency in the range of several MHz to several tens of MHz.

Impedance characteristics of the transmission line 400 may be changed via changes in physical characteristics of the implemented coaxial cable, RF strap, RF rod, and the like. For example, when the transmission line 400 is implemented as the coaxial cable, the impedance characteristics of the transmission line 400 may be changed by changing a length of the coaxial cable. Also, when the transmission line 400 is implemented as the RF strap or the RF rod, the impedance characteristics of the transmission line 400 may be changed by changing a length of the strap conductor or the rod conductor, changing a space size of the ground housing, or changing a dielectric constant and/or permeability of the insulator.

The transmission line 400 may include a first transmission line 410 and a second transmission line 420. The first transmission line 410 may be connected to the first, second, and third sources 110, 120, and 130 to be connected to the electrostatic chuck 530 inside the plasma chamber 500. In addition, the second transmission line 420 may be connected to the fourth source 140 to be connected to the first and second coils 551 and 552 inside the plasma chamber 500. According to another example embodiment, the second transmission line 420 may be connected to the fourth source 140 to be connected to the conductor plate (590 of FIG. 4) inside the plasma chamber 500. However, the embodiment is an example, and apparatuses connected to the first and second transmission lines 410 and 420 may be variously modified. Also, as described above, the number of sources connected to each transmission line 400 may be variously modified.

The plasma chamber 500 may be divided into the first area A1 and the second area A2. Also, the plasma chamber 500 may include the chamber body 510, the electrostatic chuck 530, the first and second coils 551 and 552, and a distribution plate 570. The distribution plate 570 may include an ion filter and a gas hole. The first area A1 may be located in a lower portion of the chamber body 510, and the electrostatic chuck 530 may be arranged in the first area A1. The second area A2 may be located in an upper portion of the chamber body 510, and the first and second coils 551 and 552 may be arranged in the second area A2. The first area A1 and the second area A2 may be partitioned by the distribution plate 570.

The plasma chamber 500 may be a chamber for a plasma process, and plasma may be generated therein. The plasma chamber 500 may be a CCP chamber, an ICP chamber, or a CCP and ICP combined chamber. However, the plasma chamber 500 is not limited to the chambers stated above. For reference, according to a type of a plasma chamber and a type of RF power applied to the plasma chamber, a plasma processing apparatus may be classified into a CCP type, an ICP type, and a CCP and ICP combined type. The plasma processing apparatus 1000 of the example embodiment may include a CCP type or an ICP type. Also, the plasma processing apparatus 1000 of the example embodiment may be implemented as a CCP and ICP combined type.

The chamber body 510 may define a reaction space in which plasma is formed, and seal the reaction space from the outside. The chamber body 510 may be normally formed of a metal material, and may maintain a ground state to block noise from the outside during the plasma process. The chamber body 510 may have a gas inlet, a gas outlet, a view-port, and the like formed thereat. A process gas needed for the plasma process may be supplied via the gas inlet. Here, the process gas may refer to all gases needed in a plasma process, such as a source gas, a reaction gas, and a purge gas. After the plasma process, gases inside the plasma chamber 500 may be exhausted to the outside through the gas outlet. In addition, pressure inside the plasma chamber 500 may be adjusted via the gas outlet. One or more view-ports may be formed in the chamber body 510, and the inside of the plasma chamber 500 may be monitored via the view-ports.

Also, a gas supply 522 supplying the process gas may be connected above the second area A2 of the plasma chamber 500 via a gas pipe 524. The gas supply 522 and the gas pipe 524 may be referred to as a gas supply unit 520. The gas pipe 524 may inject, into the plasma chamber 500, process gases supplied through a plurality of injection holes. When the gas supply 522 distributes a process gas into the plasma chamber 500, the gas pipe 524 may perform spatial control of the process gas. For example, the gas pipe 524 may inject the process gas into respective spaces of the plasma chamber 500 at different concentrations.

The electrostatic chuck 530 may be arranged in a lower portion of the first area A1 of the plasma chamber 500. The wafer 2000 to be subjected to the plasma process may be arranged and fixed on an upper surface of the electrostatic chuck 530. The electrostatic chuck 530 may fix the wafer 2000 by an electrostatic force. In addition, the electrostatic chuck 530 may include a bottom electrode for the plasma process. The electrostatic chuck 530 may be connected to the RF power source 100 via the first transmission line 410. In particular, the electrostatic chuck 530 may be connected to the first, second, and third sources 110, 120, 130 via the first transmission line 410. In other words, the electrostatic chuck 530 may be connected to the first RF power source 100a. Accordingly, pieces of RF power from the RF power source 100 may be applied into the plasma chamber 500 via the electrostatic chuck 530.

The first coil 551 and the second coil 552 may be arranged in an upper portion of the second area A2 of the plasma chamber 500. The first coil 551 and the second coil 552 may be connected to the RF power source 100, such that generation of plasma may be spatially controlled inside the plasma chamber 500. The first coil 551 and the second coil 552 may be connected to the RF power source 100 via the second transmission line 420. In particular, the first coil 551 and the second coil 552 may be connected to the fourth source 140 via the second transmission line 420. In other words, the first coil 551 and the second coil 552 may be connected to the second RF power source 100b. Accordingly, RF power from the RF power source 100 may be applied into the plasma chamber 500 via the first coil 551 and the second coil 552.

From a planar viewpoint, the first coil 551 may surround a side of the second coil 552. In other words, the first coil 551 may be positioned in a same plane as the second coil 552 and may surround the second coil 552. When an intensity of a current applied to the first coil 551 and an intensity of a current applied to the second coil 552 are different from each other, generation of plasma may be spatially controlled in the second area A2. For example, a ratio of the intensity of the current applied to the second coil 552 to the intensity of the current applied to the first coil 551 may be about 10% to about 1000%.

The distribution plate 570 may be arranged between the first area A1 and the second area A2 of the plasma chamber 500. The ion filter and the gas hole of the distribution plate 570 may pass plasma generated in the second area A2 to the first area A1. The plasma generated in the second area A2 may be filtered through the ion filter and the gas hole of the distribution plate 570 and move to the first area A1. The distribution plate 570 may include a top electrode. For example, the distribution plate 570 may be connected to ground in the plasma process.

The plasma processing apparatus 1000 may include at least one RF sensor. The RF sensor may be arranged at an output terminal of the RF power source 100, or an input terminal or an output terminal of the matcher 200, or the like to measure RF power delivered to the plasma chamber 500 and/or impedance of the plasma chamber 500. The delivery of the RF power to the plasma chamber 500 may be effectively managed and adjusted by monitoring a state of the plasma chamber 500 via the RF sensor, and accordingly, the plasma process may be performed precisely.

Although etching is mainly described above, the plasma processing apparatus 1000 of the example embodiment may be equipment for a deposition process or a cleaning process. Accordingly, the plasma processing apparatus 1000 of the example embodiment may uniformly perform deposition or cleaning on the wafer 2000 to be subjected to the plasma process by making a distribution of plasma uniform. Hereinafter, even when not mentioned in detail, the plasma processing apparatus 1000 may be used not only for an etching process but also for a deposition process or a cleaning process.

A normal plasma processing apparatus employing direct plasma technology for directly generating plasma inside a plasma chamber lacks temporal and/or spatial control over generation of plasma. Therefore, plasma is generated regardless of a progress state of processes on a wafer arranged in the plasma processing apparatus, and thus, a plasma process for the wafer is not effectively performed.

Figure 4:
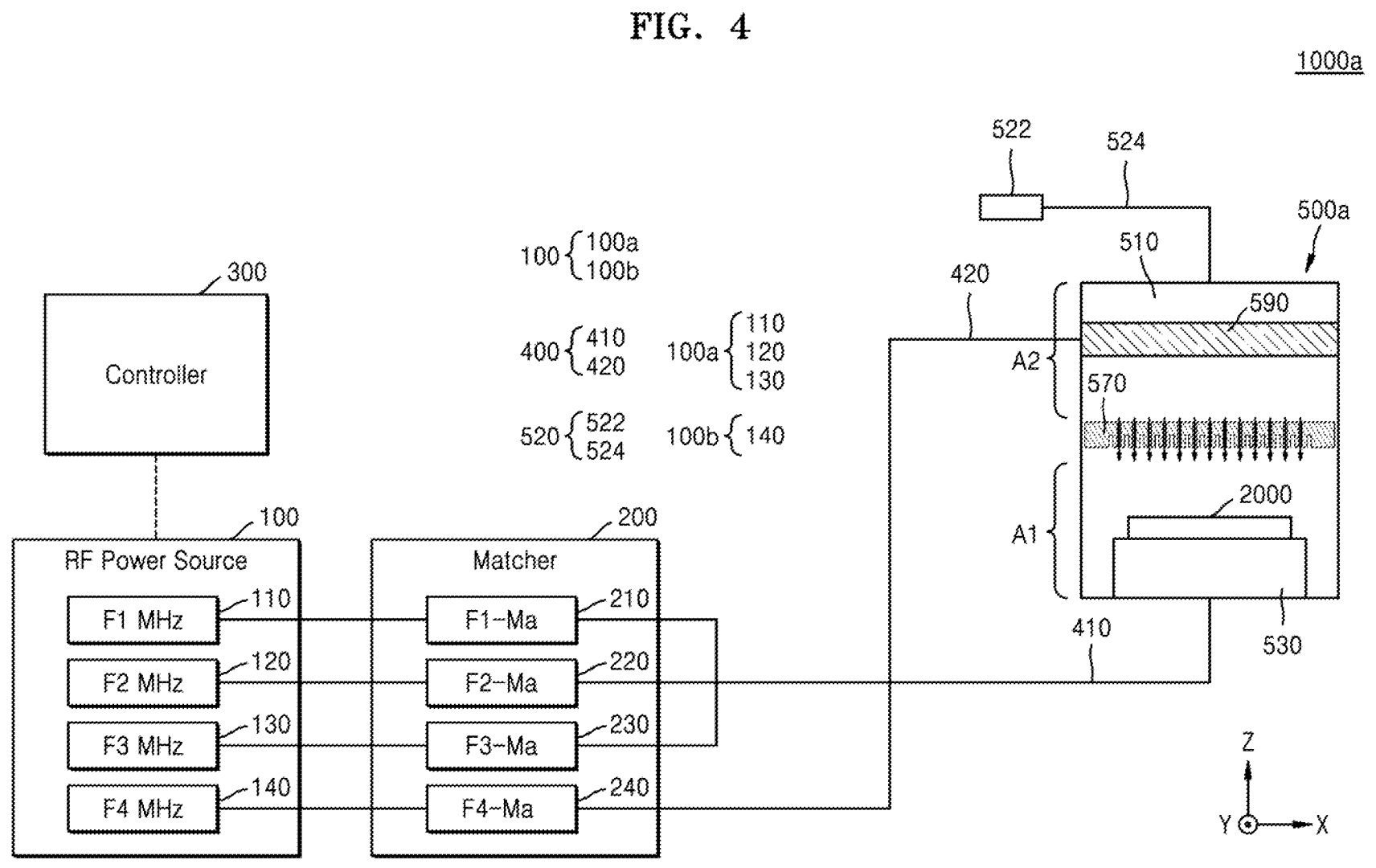

However, the plasma processing apparatus 1000 of the example embodiment may include the first and second coils 551 and 552, and/or the conductor plate 590 of FIG. 4 to provide a spatial control method for generation of plasma and/or control of plasma. Also, the plasma processing apparatus 1000 may provide temporal and/or spatial control methods for generation of plasma and/or control of plasma by changing a period of each of a signal applied from the first RF power source 100a (e.g., a first RF current), a signal applied to the first coil 551 (e.g., a first coil current), and/or a signal applied to the second coil 552 (e.g., a second coil current), and/or controlling a start time point thereof. In other words, the plasma processing apparatus 1000 of the example embodiment may temporally and/or spatially control plasma according to a progress state of processes on the wafer 2000. Therefore, the efficiency of a semiconductor process may be increased.

The relationship between the intensity of the current applied to the first coil 551 and the intensity of the current applied to the second coil 552, and the start time point of each of the signal applied from the first RF power source 100a and the signal applied to each of the first and second coils 551 and 552 will be described in detail with reference to FIGS. 2A through 2D.

FIG. 1A illustrates that the second area A2, in which the first and second coils 551 and 552 are arranged, is above the first area A1, in which the electrostatic chuck 530 is arranged, but the positional relationship between the first area A1 and the second area A2 is not limited thereto. For example, the first area A1 may be arranged to the right or left of the second area A2, and/or above the second area A2. However, when the first and second coils 551 and 552 are arranged in the second area A2, the first area A1 may not be arranged above the second area A2. In other words, second area A2 including the first and second coils 551 and 552 of the example embodiment may be arranged below the first area A1, or to the right and/or left of the first area A1.

FIGS. 2A to 2D are graphs illustrating an intensity of a signal applied to the first coil 551, an intensity of a signal applied to the second coil 552, and an intensity of a signal applied from the first RF power source 100a, according to example embodiments. The same description of FIGS. 2A to 2D as that of FIGS. 1A and 1B will be briefly given or will be omitted.

Referring to FIGS. 1A to 2D together, an intensity of a signal applied to the first coil 551, an intensity of a signal applied to the second coil 552, and an intensity of a signal applied from the first RF power source 100a may be controlled according to a waveform of a periodic function. FIGS. 2A to 2D illustrate that the periodic function is applied in the form of a rectangular function, but the form of the periodic function is not limited thereto. For example, the periodic function may have the form of a trigonometric function. Temporal control of plasma inside the plasma chamber 500 will now be described in detail.

A first period T1 may include a first duty D1 and a second duty D2. During the first duty D1, source power applied to the plasma chamber 500 may be first power P1. During the second duty D2, source power applied to the plasma chamber 500 may be second power P2. The first power P1 may be greater than the second power P2.

In an example, the second power P2 may be off power (i.e., 0), and, in this case, the first duty D1 may be an on duty, and the second duty D2 may be an off duty. In an example, each of the first power P1 and second power P2 may be greater than 0.

Figure 2A:
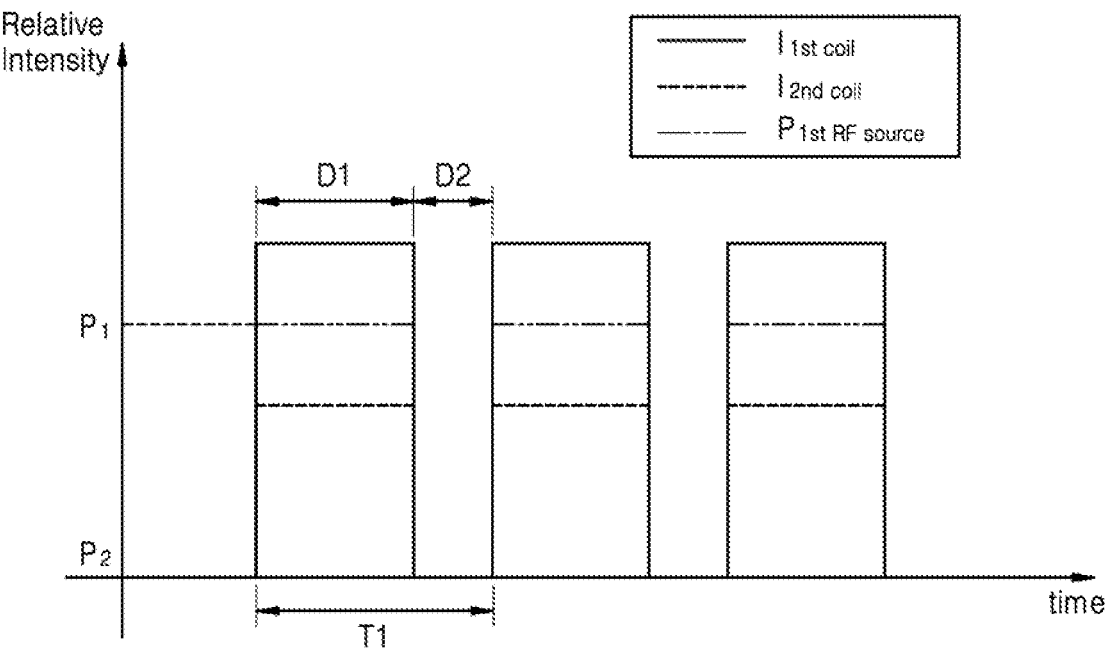
FIGS. 2A to 2D are graphs illustrating, over time, an intensity of a signal applied to a first coil, an intensity of a signal applied to a second coil, and an intensity of a signal applied from a first radio frequency (RF) power source, according to example embodiments.

Referring to FIG. 2A, the intensity of the current applied to the first coil 551 may be about twice the intensity of the current applied to the second coil 552. As described above, the intensity of the current applied to the first coil 551 may range from about 0.1 times to about 10 times the intensity of the current applied to the second coil 552. Also, the signal applied to the first coil 551, the signal applied to the second coil 552, and the signal applied from the first RF power source 100a may each have the same start time point. In addition, as shown in FIG. 2A, each of the signal applied to the first coil 551, the signal applied to the second coil 552, and the signal applied from the first RF power source 100*a* may be repeatedly changed with the period of repetition being the first period T1.

In FIG. 2A, each of the signal applied to the first coil 551, the signal applied to the second coil 552, and the signal applied from the first RF power source 100*a* may be controlled in an on/off form in which the first duty D1 is an on duty and the second duty D2 is an off duty.

According to an embodiment, a range of the first duty D1 may be about 0.05 ms to about 5 ms. According to example embodiments, the second duty D2 may be shorter than the first duty D1.

Figure 2B:
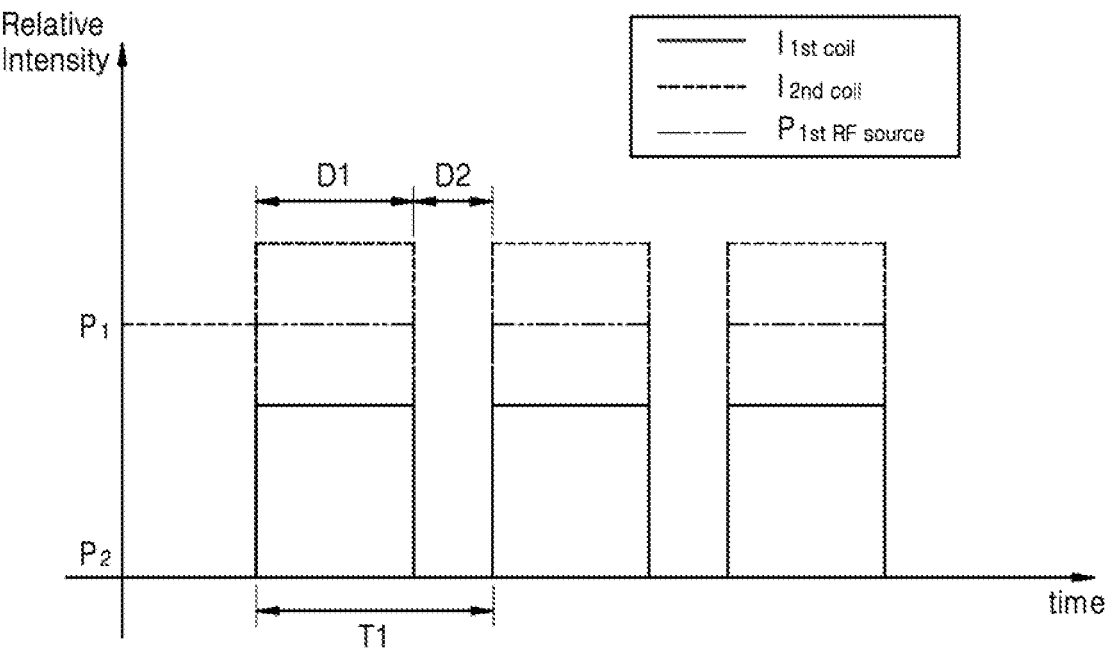

Referring to FIG. 2B, the intensity of the current applied to the first coil 551 may be about 0.5 times the intensity of the current applied to the second coil 552. Also, each of the signal applied to the first coil 551, the signal applied to the second coil 552, and the signal applied from the first RF power source 100*a* may be controlled in an on/off form in which the first duty D1 is an on duty and the second duty D2 is an off duty.

Figure 2C:
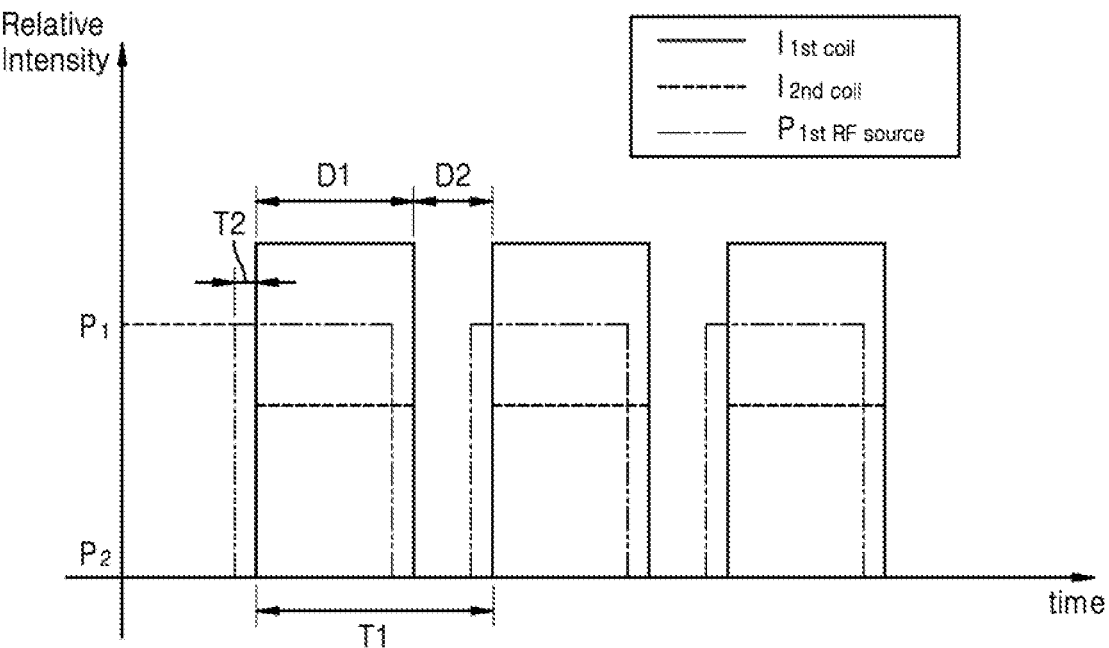

Referring to FIG. 2C, the signal applied to the first coil 551, the signal applied to the second coil 552, and the signal applied from the first RF power source 100*a* may have different start time points. A difference among the start time points of the signal applied to the first coil 551, the signal applied to the second coil 552, and the signal applied from the first RF power source 100*a*, i.e., a range of a second period T2 as shown in FIG. 2C, may be about 1 ms to about 100 ms. The second period T2 may be variously modified according to the first period T1, a type of a process gas, and/or a type of plasma. Also, each of the signal applied to the first coil 551, the signal applied to the second coil 552, and the signal applied from the first RF power source 100*a* may be controlled in an on/off form in which the first duty D1 is an on duty and the second duty D2 is an off duty.

As shown in FIG. 2C, the start time point of the signal applied from the first RF power source 100*a* may be earlier than a start time point of a signal applied from the second RF power source 100*b*. Also, the start time point of the signal applied from the first RF power source 100*a* may be later than the start time point of the signal applied from the second RF power source 100*b*.

Figure 2D:
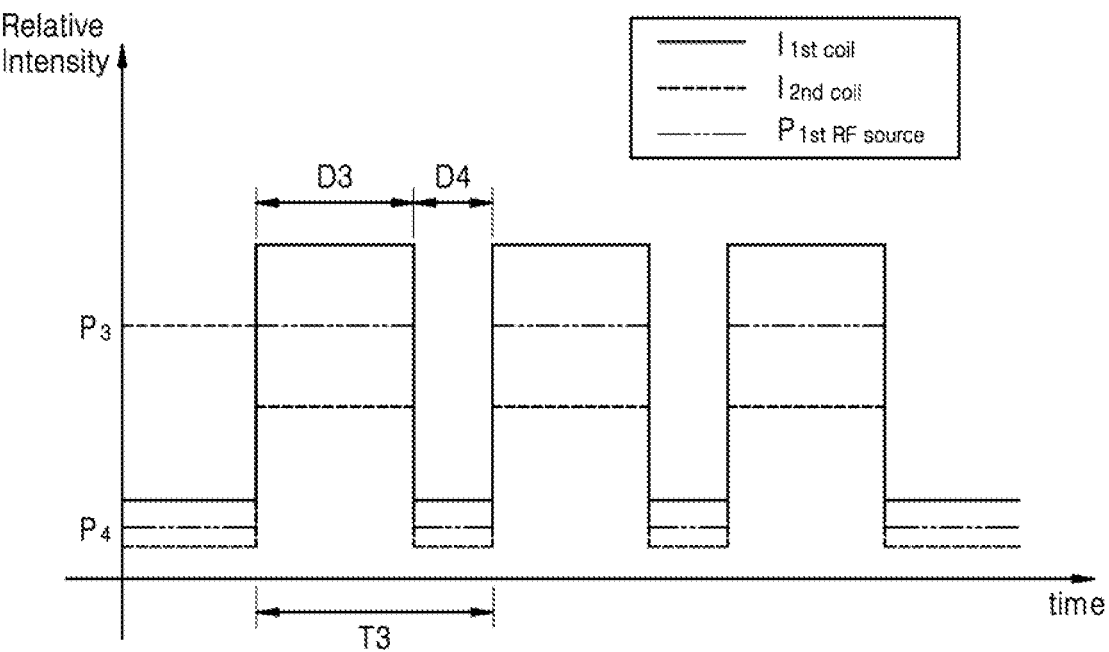

Referring to FIG. 2D, each of the signal applied to the first coil 551, the signal applied to the second coil 552, and the signal applied from the first RF power source 100*a* may be repeatedly changed with a third period T3. The third period T3 may include a third duty D3 and a fourth duty D4. During the third duty D3, source power applied to the plasma chamber 500 may be third power P3. During the fourth duty D4, source power applied to the plasma chamber 500 may be fourth power P4. The third power P3 may be greater than the fourth power P4. Both the third power P3 and the fourth power P4 may be greater than 0, and may be controlled in a high/low form in which the third power P3 is greater than the fourth power P4. In other words, a signal of each of first power and second power may maintain an on duty during a time for which plasma is generated.

Figure 3A:
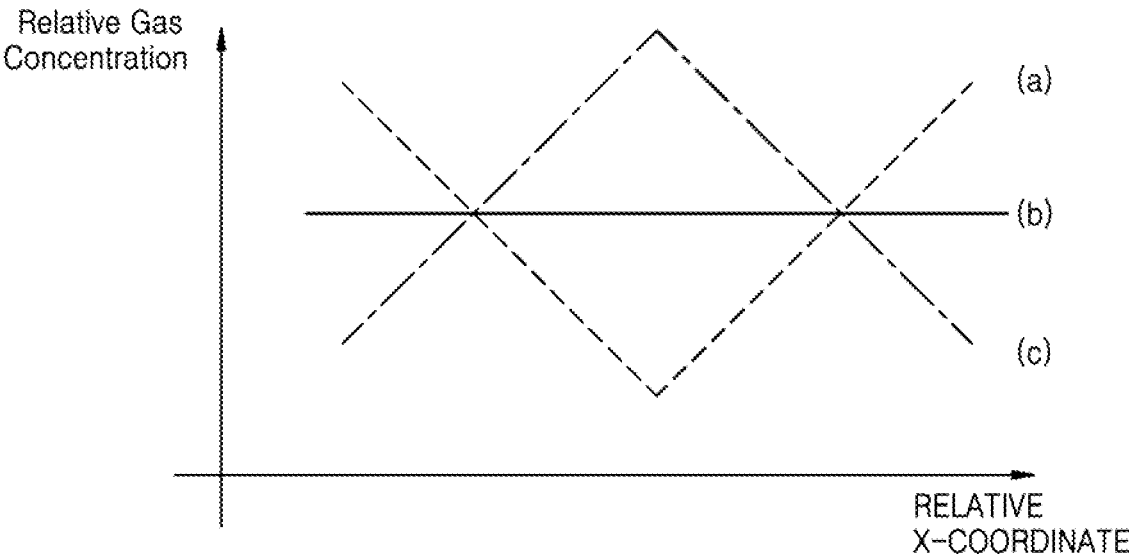
FIGS. 3A and 3B are graphs illustrating distributions of a process gas in a space inside a plasma chamber, according to an example embodiment.
Figure 3B:
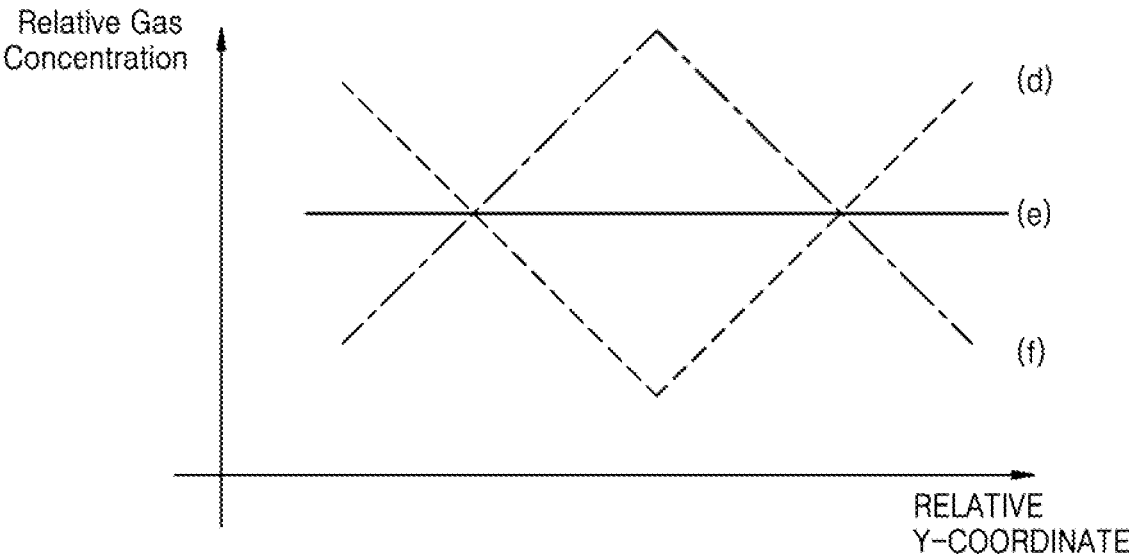

FIGS. 3A and 3B are graphs illustrating distributions of a process gas in a space inside the plasma chamber 500, according to an embodiment. The same description of FIGS. 3A and 3B as that of FIGS. 1A to 2D will be briefly given or omitted. Also, temporal control of plasma inside the plasma chamber 500 will be described in detail.

Referring to FIGS. 1A to 3B together, distributions of a process gas along first and second directions (e.g., X and Y directions as shown in FIG. 1A) may be different from each other. Graph lines (a) to (c) of FIG. 3A illustrate concentrations of different components of the process gas in a first horizontal direction (an X direction), and graph lines (d) to (f) of FIG. 3B illustrate concentrations of different components of the process gas in a second horizontal direction (a Y direction). For example, a first composition ratio of different components (a) to (c) of the process gas at a first horizontal position in the X direction is different from a second composition ratio of the different components (a) to (c) of the process gas at a second horizontal position in the X direction. For example, a first composition ratio of different components (d) to (f) of the process gas at a first horizontal position in the Y direction is different from a second composition ratio of the different components (d) to (f) of the process gas at a second horizontal position in the Y direction.

Graph lines (a) to (f) of FIGS. 3A and 3B are examples, and the distributions of the process gas along a horizontal direction are not limited thereto. A distribution of a process gas injected in a horizontal space from the gas pipe 524 may be changed via spatial control of the process gas. For example, according to a distribution of plasma in the first area A1, the gas pipe 524 may be controlled, and thus, a distribution of a process gas in a horizontal space may be changed.

In more detail, a plasma sensor measuring a distribution of plasma may be arranged inside the plasma chamber 500. On the basis of a measured value by the plasma sensor, the controller 300 may spatially and/or temporally control plasma inside the plasma chamber 500.

According to an embodiment, for spatial control of plasma inside the plasma chamber 500, the controller 300 may control the gas pipe 524 or may control relative intensities of currents applied to the first and second coils 551 and 552.

FIG. 4 is a block diagram of a plasma processing apparatus 1000*a* according to an example embodiment. The same description of FIG. 4 as that of FIGS. 1A to 3B will be briefly given or omitted.

Referring to FIG. 4, the plasma processing apparatus 1000*a* of the example embodiment may be different from the plasma processing apparatus 1000 of FIG. 1A in terms of having a structure in which a fourth source 140 is applied to a plasma chamber 500*a* via the conductor plate 590 of the plasma chamber 500*a*. The conductor plate 590 may be arranged in a second area A2 of the plasma chamber 500*a*. In detail, in the plasma processing apparatus 1000*a* of the example embodiment, the conductor plate 590 of the plasma chamber 500*a* may include a top electrode, and a second RF power source 100*b* may be connected to the conductor plate 590. Accordingly, pieces of RF power from an RF power source 100 may be applied to the plasma chamber 500*a* via a matcher 200, a controller 300, a second transmission line 420, and the conductor plate 590.

In other words, the plasma processing apparatus 1000*a* may have a structure in which pieces of RF power may be applied to both an electrostatic chuck 530 and the conductor plate 590. In such a structure, the RF power source 100, the matcher 200, and the controller 300 may be connected to each of the electrostatic chuck 530 and the conductor plate 590. In addition, when a plasma process is performed via the plasma processing apparatus 1000*a* having such a structure, pieces of RF power may be applied via either the electrostatic chuck 530 or the conductor plate 590. Also, according to embodiments, pieces of RF power may be alternately applied to the electrostatic chuck 530 and the conductor plate 590.

As described above, for example, first, second, and third sources 110, 120, and 130 may be connected to the electrostatic chuck 530 via a first transmission line 410, and the fourth source 140 may be connected to the conductor plate 590 via a second transmission line 420. FIG. 4 illustrates that the second area A2 is arranged above a first area A1, but the positional relationship between the first area A1 and the second area A2 is not limited thereto. For example, the first area A1 may be arranged above the second area A2, or to the right and/or left of the second area A2.

Figure 5:
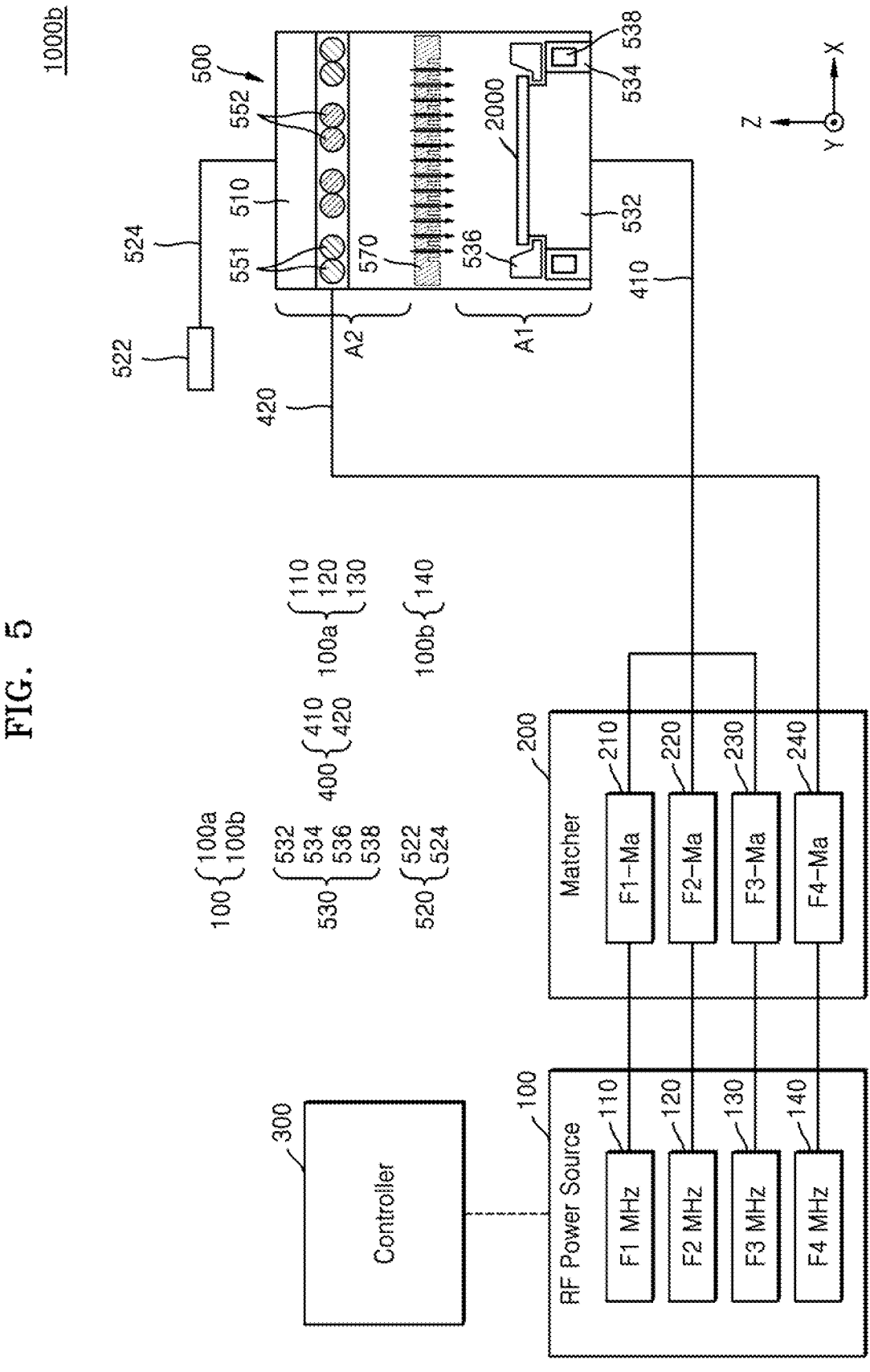
FIG. 5 is a block diagram of a plasma processing apparatus according to an example embodiment.

FIG. 5 is a block diagram of a plasma processing apparatus 1000b according to an example embodiment.

Referring to FIG. 5, when a structure of an electrostatic chuck 530 inside a plasma chamber 500 is described in more detail, the electrostatic chuck 530 may include an electrode portion 532, an insulating isolation 534, an edge ring 536, and a conductive ring 538. The electrode portion 532 may be arranged at a central portion of a first area A1 of the plasma chamber 500, and include an electrode for applying power for chucking/de-chucking and plasma processes, and the like for a wafer 2000. The wafer 2000 to be subjected to the plasma process may be arranged on an upper surface of the electrode portion 532 and fixed by an electrostatic force.

The insulating isolation 534 may have a structure surrounding the electrode portion 532, and the insulating isolation 534 may be formed of, for example, an insulator such as alumina. However, the material of the insulating isolation 534 is not limited thereto.

The edge ring 536 may have a structure surrounding the wafer 2000 and may be arranged outside the electrode portion 532. The edge ring 536 may be formed of silicon, and prevent plasma from concentrating on an edge portion of the wafer 2000 by inducing an effect of extending a silicon region of the wafer 2000. The edge ring 536 may include one ring type and two ring types, and the one ring type may be referred to as a focus ring, and the two ring types may be referred to as a combo-ring.

The conductive ring 538 may be arranged inside the insulating isolation 534 to surround the electrode portion 532. The conductive ring 538 may be formed of metal, such as aluminum. However, the material of the conductive ring 538 is not limited thereto. The conductive ring 538 may be electrically coupled to the edge ring 536 arranged above, and contribute to adjustment of a distribution of plasma by the edge ring 536.

For reference, the structure of the electrostatic chuck 530 inside the plasma chamber 500 of the plasma processing apparatuses 1000 and 1000a of FIGS. 1A and 4 may be substantially the same as that of the electrostatic chuck 530 of the plasma processing apparatus 1000b of the embodiment, but is simply illustrated for convenience.

Figure 6:
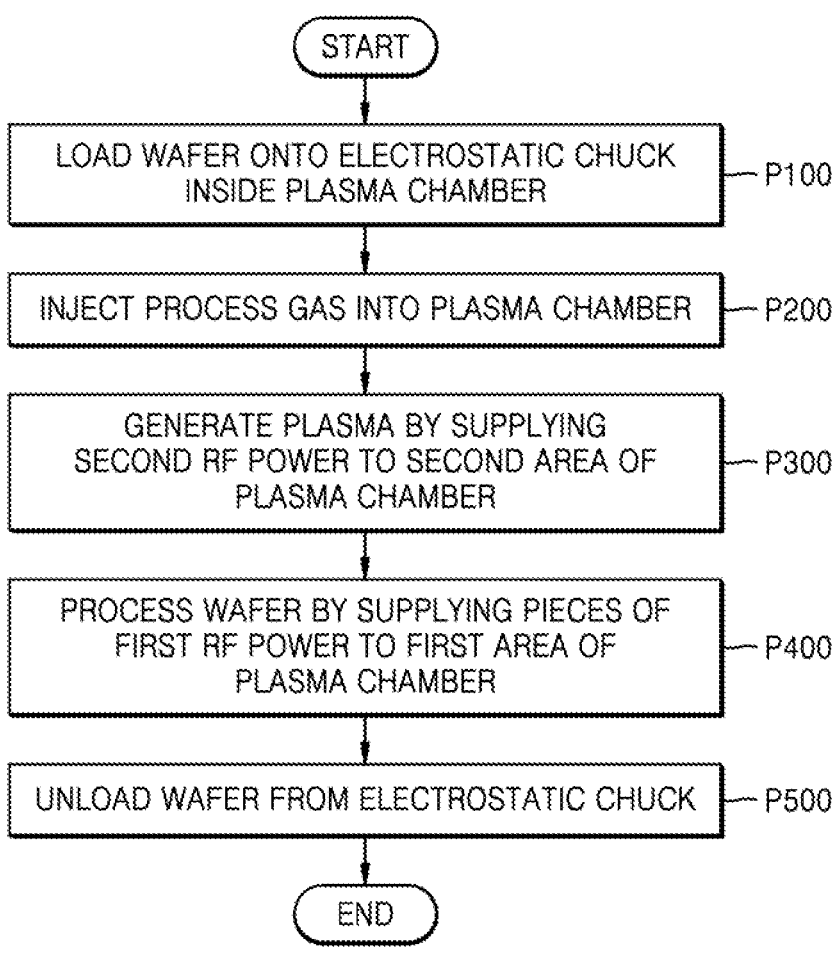
FIG. 6 is a flowchart illustrating a method of manufacturing a semiconductor device, according to an example embodiment.

FIG. 6 is a flowchart illustrating a method of manufacturing a semiconductor device, according to an example embodiment.

Referring to FIGS. 1A to 2D and 6 together, in P100, the wafer 2000 may be loaded onto the electrostatic chuck 530 arranged in the first area A1 of the plasma chamber 500. In P200, a process gas may be injected into the plasma chamber 500. In a process of injecting the process gas, a concentration of the process gas may be spatially controlled, such that plasma may be spatially controlled.

In P300, plasma may be generated by supplying second RF power to the second area A2 of the plasma chamber 500. The second RF power may be delivered to the first coil 551 and/or the second coil 552. The controller 300 may spatially control plasma by controlling intensities of currents applied to the first coil 551 and/or the second coil 552. In P300, the second RF power may be spatially controlled. The spatial control of the second RF power may be substantially the same as that described with reference to FIG. 1A.

In P400, the wafer 2000 may be processed by supplying pieces of first RF power to the first area A1 of the plasma chamber 500. The processing may be a deposition process of depositing a thin film, for example, an oxide film or a nitride film on the wafer 2000. Wafer processing may be an etching process of etching a material film formed on the wafer 2000, for example, an oxide film or a nitride film. In P400, the first RF power and the second RF power may be controlled temporally. The temporal control of the first RF power and the second RF power may be substantially the same as that described with reference to FIGS. 2A to 2D. In other words, a signal of each of the first and/or second RF power may be repetitive, and may be controlled in an on/off form or in a high/low form. Also, the signals of the first RF power and the second RF power may have the same or different periods. In addition, the signals of the first RF power and the second RF power may have the same or different start time points.

In P500, a semiconductor device may be manufactured by unloading the wafer 2000 from the electrostatic chuck 530.

While the disclosure has been particularly shown and described with reference to example embodiments thereof, it will be understood that various changes in form and details may be made therein without departing from the spirit and scope of the following claims.

What is claimed is:

1. A plasma processing apparatus comprising:
a plasma chamber comprising a first area comprising and a second area separated from the first area;
an electrostatic chuck provided in the first area of the plasma chamber, and configured to support a wafer;
a first radio frequency (RF) power source configured to transmit pieces of first RF power to the first area, wherein a first piece of the pieces of first RF power has a first frequency and a second piece of the pieces of the first RF power has a second frequency different from the first frequency;
a second RF power source configured to transmit second RF power to the second area of the plasma chamber;
a distribution plate arranged inside the plasma chamber and between the first area and the second area;
a controller configured to control the first RF power source and the second RF power source; and
a first coil and a second coil arranged in the second area, wherein the second area is directly above the first area, wherein the first coil and the second coil are positioned in a same plane and the first coil surrounds the second coil,
wherein the controller is further configured to:
spatially control plasma in the first area and the second area by controlling a signal of a current applied to the first coil and a signal of a current applied to the second coil, and
temporally control the plasma in the first area and the second area by controlling at least one of a signal of the pieces of first RF power transmitted from the first RF power source or a signal of the second RF power transmitted from the second RF power source, and
wherein the controller is further configured to change an intensity of the current applied to the first coil and an intensity of the current applied to the second coil according to a composition ratio of a process gas in the first area.

2. The plasma processing apparatus of claim 1, wherein the controller is further configured to control at least one from among:

a period of each of the signal of the pieces of first RF power, the signal of the current applied to the first coil, and the signal of the current applied to the second coil, or a start time point of each of the signal of the pieces of first RF power, the signal of the current applied to the first coil, and the signal of the current applied to the second coil.

3. The plasma processing apparatus of claim 1, wherein a first composition ratio of a process gas at a first horizontal position in the first area is different from a second composition of the process gas at a second horizontal position in the first area that is different from the first horizontal position.

4. A plasma processing apparatus comprising:

a plasma chamber comprising a first area and a second area separated from the first area;

an electrostatic chuck provided in the first area of the plasma chamber, and configured to support a wafer;

a ring-shaped edge ring surrounding the electrostatic chuck;

an insulating isolation provided at a lower portion of the electrostatic chuck, and configured to insulate the electrostatic chuck;

a first radio frequency (RF) power source configured to transmit pieces of first RF power to the first area, wherein a first piece of the pieces of first RF power has a first frequency and a second piece of the pieces of first RF power has a second frequency different from the first frequency;

a second RF power source configured to transmit second RF power to the second area;

a distribution plate arranged inside the plasma chamber between the first area and the second area, the distribution plate comprising a gas hole and an ion filter configured to filter plasma;

a controller configured to control the first RF power source and the second RF power source; and a first coil and a second coil arranged in the second area, wherein the second area is directly above the first area, wherein the first coil and the second coil are positioned in a same plane and the first coil surrounds the second coil, wherein the controller is further configured to:

spatially control the plasma in the first area and the second area by controlling a signal of a current applied to the first coil and a signal of a current applied to the second coil, and temporally control the plasma in the first area and the second area by controlling at least one of a signal of the pieces of the first RF power transmitted from the first RF power source or a signal of the second RF power transmitted from the second RF power source, and wherein the controller is further configured to change an intensity of the current applied to the first coil and an intensity of the current applied to the second coil according to a composition ratio of a process gas in the first area.

5. The plasma processing apparatus of claim 4, wherein the plasma chamber is configured such that the plasma generated in the second area passes through the gas hole and the ion filter of the distribution plate and moves to the first area.

6. The plasma processing apparatus of claim 4, wherein a range of a frequency of the first piece of the pieces of first RF power is about 400 kHz to about 2 MHz, a range of a frequency of the second piece of the pieces of first RF power is about 40 MHz to about 60 MHZ, and a range of a frequency of the second RF power is about 13 MHz to about 27 MHz.

7. The plasma processing apparatus of claim 4, wherein a range of a ratio of the intensity of the current applied to the second coil to the intensity of the current applied to the first coil is about 10% to about 1000%.

8. The plasma processing apparatus of claim 4, wherein a range of a difference between a first start time point of the signal of the pieces of first RF power and a start time point of the signal of the second RF power is about 1 ms to about 100 ms.

9. The plasma processing apparatus of claim 4, wherein the signal of the pieces of first RF power or the signal of the second RF power maintains an on duty during a time in which the plasma is generated.

10. The plasma processing apparatus of claim 4, wherein an on duty and an off duty of the signal of the pieces of first RF power or the signal of the second RF power are repeated.

11. The plasma processing apparatus of claim 10, wherein a range of an on duty time for each of the signal of the pieces of first RF power and the signal of the second RF power is about 0.5 ms to about 5 ms.

\*    \*    \*    \*    \*